(12) United States Patent
Fan et al.

(10) Patent No.: US 8,950,834 B2
(45) Date of Patent: Feb. 10, 2015

(54) SLIDE ASSEMBLY

(75) Inventors: Chen-Lu Fan, New Taipei (TW);
Jing-Chao Liang, Shenzhen (CN)

(73) Assignee: ScienBiziP Consulting(Shenzhen)Co., Ltd., Guangdong (CN)

( * ) Notice: Subject to any disclaimer, the term of this patent is extended or adjusted under 35 U.S.C. 154(b) by 458 days.

(21) Appl. No.: 13/241,210

(22) Filed: Sep. 23, 2011

(65) Prior Publication Data

US 2012/0257845 A1 Oct. 11, 2012

(30) Foreign Application Priority Data

Apr. 8, 2011 (CN) .......................... 2011 1 00087999

(51) Int. Cl.
*A47B 88/16* (2006.01)
*H05K 7/14* (2006.01)

(52) U.S. Cl.
CPC .................................. *H05K 7/1489* (2013.01)
USPC ..................................... 312/333; 312/334.44

(58) Field of Classification Search
CPC ...... H05K 7/1489; A47B 88/08; A47B 88/10; A47B 88/16; A47B 2210/07; A47B 2210/0059; A47B 2210/0081; E05B 65/46
USPC ......... 312/333, 334.44–334.47, 334.1, 334.4, 312/334.8; 384/26, 35; 211/26
See application file for complete search history.

(56) References Cited

U.S. PATENT DOCUMENTS

| | | | | |
|---|---|---|---|---|
| 3,133,768 | A * | 5/1964 | Klakovich ....................... | 384/17 |
| 4,072,375 | A * | 2/1978 | Boone .......................... | 312/334.8 |
| 2002/0057042 | A1 * | 5/2002 | Milligan .................. | 312/334.46 |
| 2002/0089272 | A1 * | 7/2002 | Liang et al. .................... | 312/333 |
| 2002/0158556 | A1 * | 10/2002 | Cheng ........................... | 312/333 |
| 2004/0155563 | A1 * | 8/2004 | Young et al. .............. | 312/334.8 |
| 2004/0239221 | A1 * | 12/2004 | Yang ........................ | 312/334.46 |
| 2005/0006996 | A1 * | 1/2005 | Milligan .................. | 312/334.46 |
| 2005/0116595 | A1 * | 6/2005 | Milligan .................. | 312/334.46 |
| 2006/0091769 | A1 * | 5/2006 | Dubon .......................... | 312/333 |
| 2007/0164644 | A1 * | 7/2007 | Hwang et al. ................. | 312/333 |
| 2008/0143226 | A1 * | 6/2008 | Huang et al. .............. | 312/334.8 |
| 2008/0303398 | A1 * | 12/2008 | Hsiung et al. ........... | 312/334.46 |
| 2009/0169140 | A1 * | 7/2009 | Chen et al. ....................... | 384/21 |
| 2010/0040313 | A1 * | 2/2010 | Juang ............................ | 384/21 |
| 2011/0100935 | A1 * | 5/2011 | Yang .............................. | 211/26 |
| 2012/0141053 | A1 * | 6/2012 | Yu et al. .......................... | 384/35 |
| 2012/0153792 | A1 * | 6/2012 | Yu et al. ......................... | 312/333 |
| 2013/0026113 | A1 * | 1/2013 | Fan et al. ........................ | 211/26 |

* cited by examiner

*Primary Examiner* — Darnell Jayne
*Assistant Examiner* — Ryan A Doyle
(74) *Attorney, Agent, or Firm* — Novak Druce Connolly Bove + Quigg LLP

(57) ABSTRACT

A slide assembly includes a first slide and a second slide slidably attached to the first slide. The first slide includes a first main plate and a pair of first flanges extending from opposite lengthwise edges of the first main plate. The second slide includes a second main plate and a pair of second flanges extending from opposite lengthwise edges of the second main plate. Each of the pair of second flanges includes a first segment extending from second main plate and abutting the second main plate and an L-shaped second segment extending from the first segment. The first segment is received in and slidable along each of the pair of first flanges. The L-shaped second segment protrudes out from each of the pair of the first flanges.

17 Claims, 7 Drawing Sheets

SLIDE ASSEMBLY

BACKGROUND

1. Technical Field

The present disclosure relates to slide assemblies, and more particularly to a three-section slide assembly.

2. Description of Related Art

Typical slide assemblies includes two or more telescoping slide segments. An outer or stationary slide segment is mounted to a frame of a rack structure. An intermediate slide segment is movably attached to the outer slide segment. An inner or load-carrying slide segment is movably attached to the intermediate slide segment. However, the combined slide segments will increase the thickness of the slide assembly. Thus, the thick slide assembly is not suitable to be used in some small casings.

Therefore, there is room for improvement within the art.

BRIEF DESCRIPTION OF THE DRAWINGS

Many aspects of the embodiments can be better understood with references to the following drawings. The components in the drawings are not necessarily drawn to scale, the emphasis instead being placed upon clearly illustrating the principles of the embodiments. Moreover, in the drawings, like reference numerals designate corresponding parts throughout the several views.

DETAILED DESCRIPTION

The disclosure is illustrated by way of example and not by way of limitation in the figures of the accompanying drawings in which like references indicate similar elements. It should be noted that references to "an" or "one" embodiment in this disclosure are not necessarily to the same embodiment, and such references mean at least one.

Figure 1:
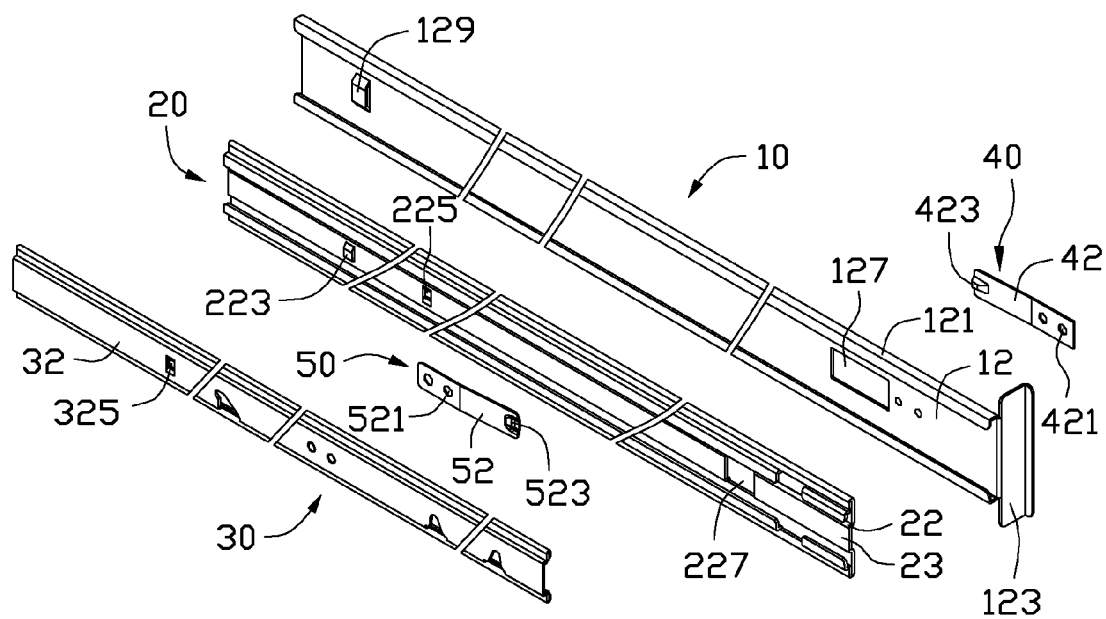
FIG. 1 is an exploded view of an embodiment of a slide assembly.
Figure 2:
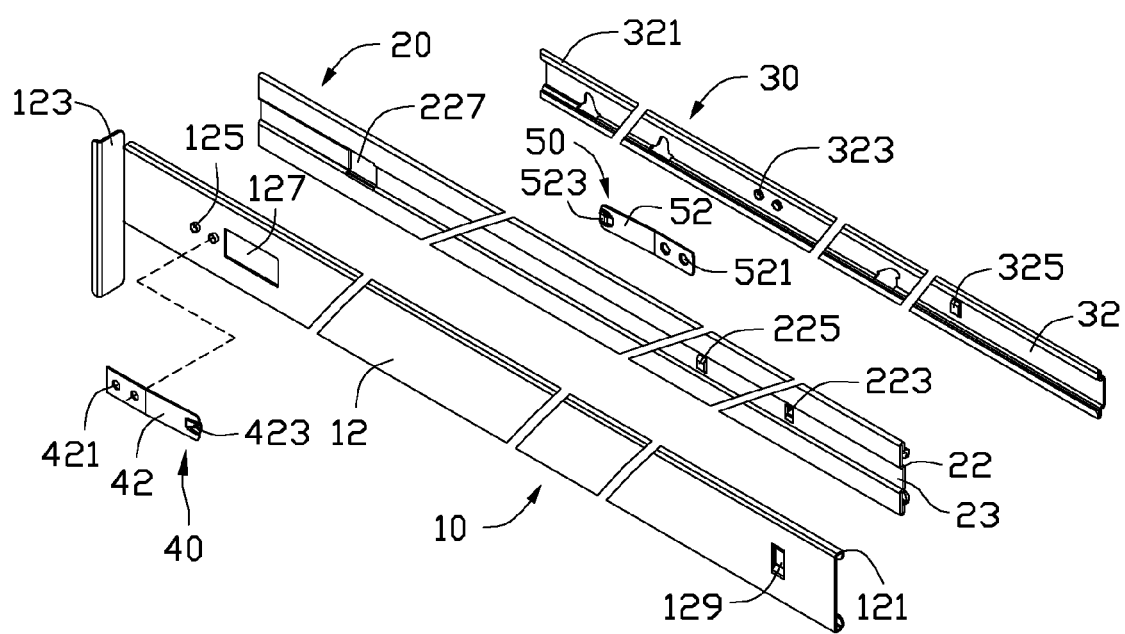
FIG. 2 is another exploded view of the slide assembly of FIG. 1.
Figure 3:
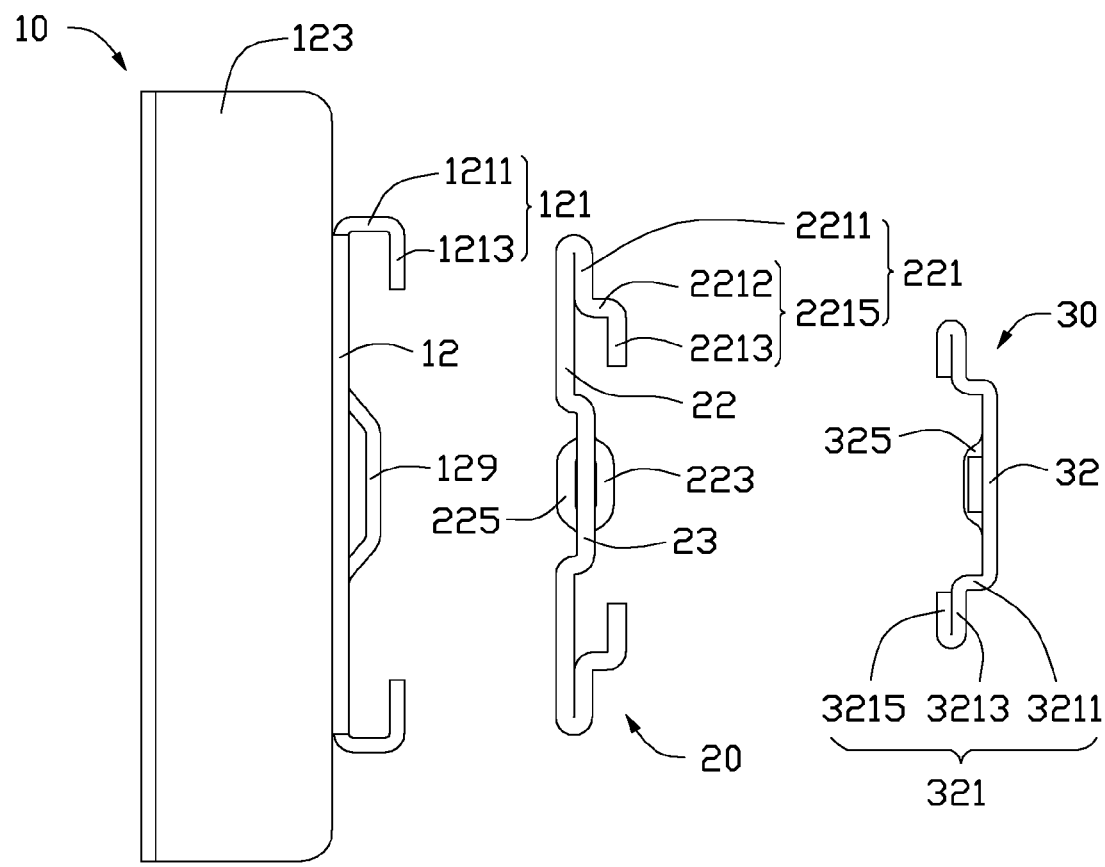
FIG. 3 illustrates front views of an outer slide, an intermediate slide, and an inner slide of the slide assembly of FIG. 1.
Figure 4:
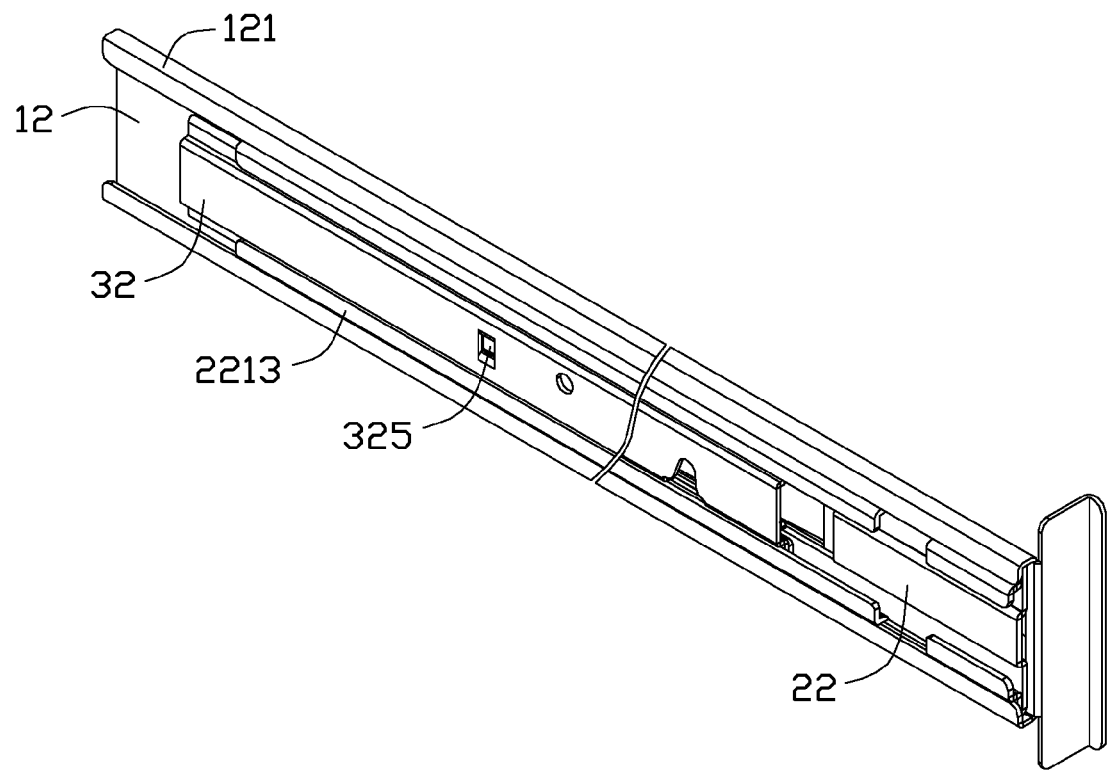
FIG. 4 is an assembled view of the slide assembly of FIG. 1, showing the slide assembly in a retracted state.
Figure 5:
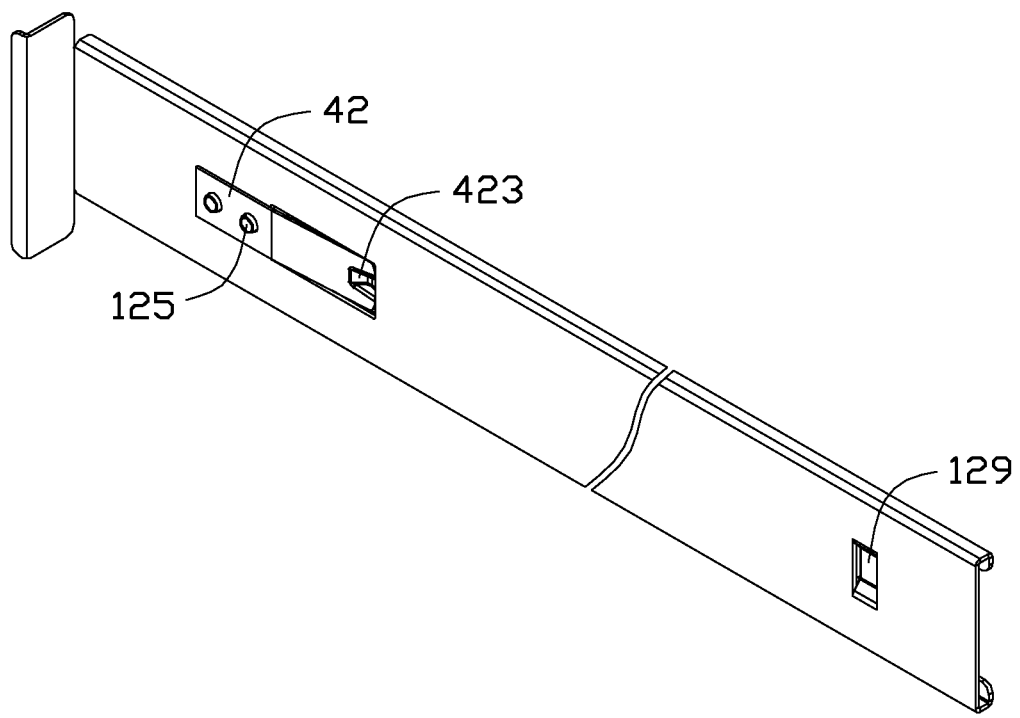
FIG. 5 is an assembled view of the slide assembly of FIG. 2, showing the slide assembly in a retracted state.
Figure 6:
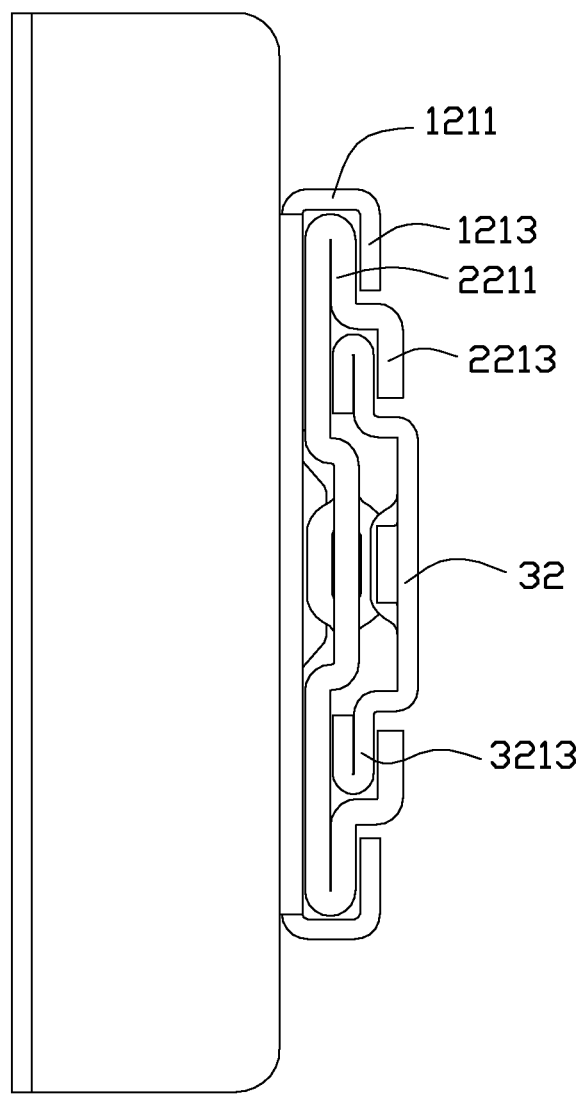
FIG. 6 is a front view of the slide assembly of FIG. 4.

Referring to FIGS. 1 to 3, an embodiment of a slide assembly includes an outer slide 10, an intermediate slide 20, an inner slide 30, a first latch member 40, and a second latch member 50.

The outer slide 10 includes a first main plate 12 and a pair of first flanges 121 extending from upper and lower lengthwise edges of the first main plate 12. Each of the pair of first flanges 121 has an L-shape and includes a horizontal segment 1211 extending substantially perpendicularly from the upper or lower lengthwise edge of the first main plate 12 and a vertical segment 1213 extending substantially perpendicularly from the horizontal segment 1211 (see FIG. 3). A securing flange 123 extends substantially perpendicularly from a front edge of the first main plate 12. The securing flange 123 can be secured to a frame of a rack structure, thereby securing the outer slide 10 to the frame. A pair of first mounting posts 125 extends substantially perpendicularly from an outer side of the first main plate 12. A first opening 127 is defined in the first main plate 12 and located at a rear side of the pair of first mounting posts 125. The pair of first mounting posts 125 and the first opening 127 are located adjacent to a front end of the outer slide 10. A first blocking protrusion 129 protrudes from the first main plate 12 towards an inner side of the first main plate 12. The first blocking protrusion 129 is located adjacent to a rear end of the first main plate 12.

The intermediate slide 20 includes a second main plate 22 and a pair of second flanges 221 extending from upper and lower lengthwise edges of the second main plate 22. The second main plate 22 is not a flat plate. A lengthwise protruding portion 23 protrudes from a central portion of the second main plate 22. Each of the pair of second flanges 221 includes a first segment 2211 extending from the second main plate 22 and abutting an inner side of the second main plate 22 and an L-shaped second segment 2215 extending from the first segment 2211. The L-shaped second segment 2215 includes a horizontal portion 2212 extending substantially perpendicularly from the first segment 22111 and a vertical portion 2213 extending substantially perpendicularly from the horizontal portion 2212. A second blocking protrusion 223 protrudes from the second main plate 22 to an inner side of the second main plate 22. A third blocking protrusion 225 protrudes from the second main plate 22 to an outer side of the second main plate 22. The third blocking protrusion 225 is located in front of the second blocking protrusion 223. The second blocking protrusion 223 and the third blocking protrusion 225 are located at a rear portion of the intermediate slide 20. A second opening 227 is defined in the second main plate 22 and located adjacent to a front end of the intermediate slide 20.

The inner slide 30 includes a third main plate 32 and pair of third flanges 321 extending from upper and lower lengthwise edges of the third main plate 32. Each of the pair of third flanges 321 includes a horizontal part 3211 extending substantially perpendicularly from the upper or lower lengthwise edge of the third main plate 32, a vertical part 3213 extending substantially perpendicularly from the horizontal part 3211, and an overlapping part 3215 extending from the vertical part 3213 and abutting the vertical part 3213. A pair of second mounting posts 323 protrudes substantially perpendicularly from an outer side of the third main plate 32. A fourth blocking protrusion 325 protrudes from the third main plate 32 to the outer side of the inner slide 30. The pair of second mounting posts 323 is located at a central portion of the inner slide 30. The fourth blocking protrusion 325 is located at a rear portion of the inner slide 30.

In one embodiment, the pair of first flanges 121 of the outer slide 10 is located at the inner side of the outer slide 10. The pair of second flanges 221 of the intermediate slide 20 is located at the inner side of the intermediate slide 20. The pair of third flanges 321 of the inner slide 30 is located at the outer side of the inner slide 30.

The first latch member 40 includes a first main piece 42 made from rigid resilient materials. A pair of first mounting holes 421 is defined in the first main piece 42 corresponding to the pair of first mounting posts 125. The pair of first mounting holes 421 is located at a first end of the first main piece 42. A first sloping protrusion 423 protrudes from a second end of the first main piece 42.

The second latch member 50 is similar to the first latch member 40. The second latch member 50 includes a second main piece 52 made from rigid resilient materials. A pair of second mounting holes 521 is defined in the second main piece 52 corresponding to the pair of second mounting posts 323. The pair of second mounting holes 521 is located at a first end of the second main piece 52. A second sloping protrusion 523 protrudes from a second end of the second main piece 52.

Referring to FIGS. 1 to 6, in assembly, the pair of first mounting posts 125 is engaged into the pair of first mounting holes 421. The first latch member 42 is attached to the outer side of the outer slide 10. The first sloping protrusion 423 at the second end of the first latch member 40 extends to the inner side of the outer slide 10 via the first opening 127. The second end of the first latch member 40 is aligned with a rear edge of the first opening 127. The intermediate slide 20 is slid into the outer slide 10 from the front end of the outer slide 10. The upper and lower portions with the first sections 2211 of the intermediate slide 20 is received in and slidable along the pair of first flanges 121. The third blocking protrusion abuts and presses the first sloping protrusion 423. The second end of the first latch member 40 is resiliently deformed, thereby the first sloping protrusion 423 moves to the outer side of the outer slide 10 via the first opening 127. The second end of the first latch member 40 rebounds to its original position when the third blocking protrusion 225 comes across the first sloping protrusion 423. The first sloping protrusion 423 extends to the inner side of the outer slide 10 again. The intermediate slide 20 slides into the outer slide 10 along the pair of first flanges 121 until the rear end of the intermediate slide 20 abuts the first blocking protrusion 129. Then the intermediate slide 20 slides to its retracted position. The pair of second mounting posts 323 is engaged into the pair of second mounting holes 521. The second latch member 50 is attached to the outer side of the inner slide 30. The inner slide 30 slides into the intermediate slide 20. The vertical part 3213 and the overlapping part 3215 of each third flange 321 are received in and slidable along the L-shaped second segment 2215 of each second flange 221. The inner slide 30 slides to its retracted position when the fourth blocking protrusion 325 abuts the second blocking protrusion 223. In one embodiment, after the first latch member 40 and the second latch member 50 are attached to the outer slide 10 and the inner slide 30, the first sloping protrusion 423 is slanted backward and the second sloping protrusion 523 is slanted forward.

Figure 7:
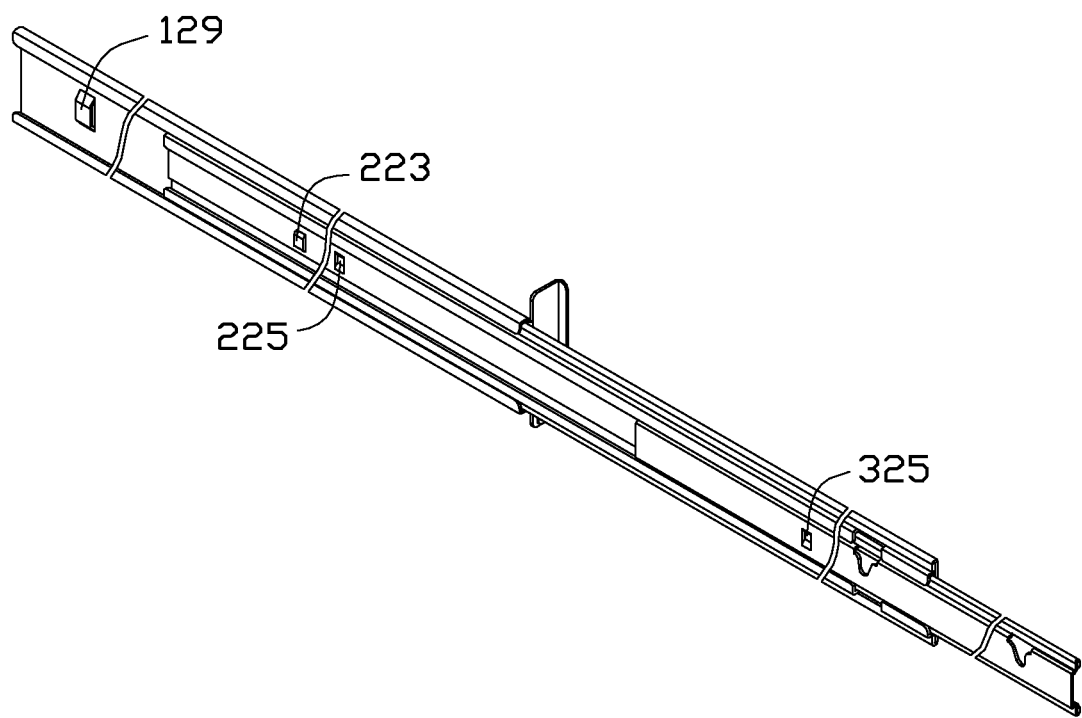
FIG. 7 is similar to FIG. 4, but showing the slide assembly in an extracted state.

Referring to FIG. 7, to extend the slide assembly, the intermediate slide 20 slides forward along the outer slide 10. When the third blocking protrusion 225 is slid to abut against the first sloping protrusion 423, the intermediate slide 20 slides to its extended position and cannot slide any further. The inner slide 30 slides forward along the intermediate slide 20. When the second sloping protrusion 523 reaches the second opening 227 and abuts against a front edge of the second opening 227, the inner slide 30 slides to its extended position and cannot slide any further.

In one embodiment, the particular shaped-flanges of the intermediate slide 20 and the inner slide 30 can make the slide assembly thinner, which utilizes less space in a casing.

While the present disclosure has been illustrated in detail in one or more embodiments, it is not intended to restrict or in any way limit the scope of the appended claims to such detail. Additional advantages and modifications within the spirit and scope of the present disclosure will readily appear to those skilled in the art, and the present disclosure is not to be limited to the specific details and illustrative examples shown and described.

What is claimed is:

1. A slide assembly comprising:
   a first slide comprising a first main plate and a pair of first flanges extending from opposite lengthwise edges of the first main plate; and each of the pair of first flanges having an L-shape and comprising a horizontal segment extending substantially perpendicularly from the first main plate and a vertical segment extending substantially perpendicularly from the horizontal segment;
   a first blocking protrusion located on the first main plate;
   a second slide slidably attached to the first slide, and comprising a second main plate and a pair of second flanges extending from opposite lengthwise edges of the second main plate, a protruding portion protruding from the second main plate; a second blocking protrusion located on a first side of the protruding portion, and a third blocking protrusion located on a second opposite side of the protruding portion; each of the pair of second flanges comprising a first segment extending from the second main plate and abutting the second main plate and an L-shaped second segment extending from the first segment, the first segment being received in and slidable along each of the pair of first flanges, and the L-shaped second segment protruding out from each of the pair of the first flanges;
   a third slide comprising a third main plate, and a fourth blocking protrusion located on the third main plate;
   a first latching member secured to the first slide and comprising a first sloping protrusion; and
   a second latch member secured to the third slide and comprising a second sloping protrusion;
   wherein the first sloping protrusion abuts the third blocking protrusion, for preventing the second slide from sliding, and the second blocking protrusion abuts the fourth blocking protrusion, for preventing the second slide from sliding relative to the third slide.

2. The slide assembly of claim 1, wherein the first segment abuts an inner side of the vertical segment.

3. The slide assembly of claim 1, wherein the third slide is slidably attached to the second slide and held by the L-shaped second segment.

4. The slide assembly of claim 3, wherein the third slide futher comprises a pair of third flanges extending from opposite lengthwise edges of the third main plate, and each of the pair of third flanges is partially located inside the L-shaped second segment and partially exposed out from the L-shaped second segment.

5. The slide assembly of claim 4, wherein each of the pair of third flanges comprises a horizontal part extending substantially perpendicularly from the third main plate, a vertical part extending substantially perpendicularly from the horizontal part, and an overlapping part extending from the vertical part and laying on the vertical part.

6. The slide assembly of claim 5, wherein the vertical part and the overlapping part are located inside the L-shaped second segment, and the horizontal part is exposed out from the L-shaped second segment.

7. The slide assembly of claim 6, wherein the L-shaped second segment comprises a horizontal portion extending substantially perpendicularly from the first segment and a vertical portion extending substantially perpendicularly from the horizontal portion, and the vertical part abuts an inner surface of the vertical portion.

8. The slide assembly of claim 1, wherein a first opening is defined in the first main plate, the first latch member is attached to an outer side of the first slide, and the first sloping protrusion is formed at a resilient end of the first latch member and extends to an inner side of the first slide via the first opening.

9. The slide assembly of claim 8, further comprising the second latch member attached to the third slide, wherein a second opening is defined in the second slide, the a second sloping protrusion abuts an edge of the second opening when the third slide slides to its full extended position; and the first sloping protrusion and the second sloping protrusion are oriented in opposite directions.

10. A slide assembly comprising:
a first slide comprising a first main plate and a pair of first flanges extending from opposite lengthwise edges of the first main plate; and a first blocking protrusion located on the first main plate; and
a first latching member secured to the first slide and comprising a first sloping protrusion;
a second slide slidably attached to the first slide, and comprising a second main plate and a pair of second flanges extending from opposite lengthwise edges of the second main plate, a protruding portion protruding from the second main plate; a second blocking protrusion located on a first side of the protruding portion, and a third blocking protrusion located on a second opposite side of the protruding portion; and each of the pair of second flanges being partially received in and slidable along each of the pair of first flanges and partially protruding out from each of the pair of first flanges; a third slide slidably attached to the second slide, and comprising a third main plate and a pair of third flanges extending from opposite lengthwise edges of the third main plate, each of the pair of third flanges being partially received in and slidable along each of the pair of second flanges and partially exposed out from each of the pair of second flanges, and a fourth blocking protrusion located on the third main plate; and
a second latch member secured to the third slide and comprising a second sloping protrusion;
wherein the first sloping protrusion abuts the third blocking protrusion, for preventing the second slide from sliding; and the second blocking protrusion abuts the fourth blocking protrusion, for preventing the second slide from sliding relative to the third slide.

11. The slide assembly of claim 10, wherein each of the pair of second flanges comprises a first segment extending from the second main plate and abutting the second main plate and an L-shaped second segment extending from the first segment, the first segment being received in and slidable along each of the pair of first flanges, and the L-shaped second segment protruding out from each of the pair of the first flanges.

12. The slide assembly of claim 11, wherein each of the pair of first flanges has an L-Shape and comprises a horizontal segment extending from the first main plate and a vertical segment extending substantially perpendicularly from the horizontal segment, and the first segment abuts an inner side of the vertical segment.

13. The slide assembly of claim 12, wherein each of the pair of third flanges comprises a horizontal part extending substantially perpendicularly from the third main plate, a vertical part extending substantially perpendicularly from the horizontal part, and an overlapping part extending from the vertical part and laying on the vertical part.

14. The slide assembly of claim 13, wherein the vertical part and the overlapping part are located inside the L-shaped second segment, and the horizontal part is exposed out from the L-shaped second segment.

15. The slide assembly of claim 14, wherein the L-shaped second segment comprises a horizontal portion extending substantially perpendicularly from the first segment and a vertical portion extending substantially perpendicularly from the horizontal portion, and the vertical part abuts an inner surface of the vertical portion.

16. The slide assembly of claim 10, wherein a first opening is defined in the first main plate, the first latch member is attached to an outer side of the first slide, and the first sloping protrusion is formed at a resilient end of the first latch member and extends to an inner side of the first slide via the first opening.

17. The slide assembly of claim 16, wherein a second opening is defined in the second slide, the second sloping protrusion abuts an edge of the second opening when the third slide slides to its full extended position; and the first sloping protrusion and the second sloping protrusion are oriented in opposite directions.

* * * * *